United States Patent [19]

Burkey et al.

[11] Patent Number: 4,613,895

[45] Date of Patent: Sep. 23, 1986

[54] COLOR RESPONSIVE IMAGING DEVICE EMPLOYING WAVELENGTH DEPENDENT SEMICONDUCTOR OPTICAL ABSORPTION

[75] Inventors: Bruce C. Burkey; Roger S. VanHeyningen, both of Rochester, N.Y.; Richard A. Spaulding, Longwood, Fla.; Edward L. Wolf, Ames, Iowa

[73] Assignee: Eastman Kodak Company, Rochester, N.Y.

[21] Appl. No.: 959,830

[22] Filed: Nov. 13, 1978

Related U.S. Application Data

[63] Continuation-in-part of Ser. No. 885,920, Mar. 13, 1978, abandoned, which is a continuation of Ser. No. 780,944, Mar. 24, 1977, abandoned.

[51] Int. Cl.$^4$ .................................................. H04N 9/04
[52] U.S. Cl. .................................................. 358/41; 358/43; 358/48; 358/44; 357/24; 357/29; 357/30
[58] Field of Search ............... 358/41, 43, 44, 48, 358/213; 357/30, 24, 29

[56] References Cited

U.S. PATENT DOCUMENTS

| | | | |
|---|---|---|---|
| 3,502,289 | 1/1976 | Chai | 358/41 |
| 3,576,392 | 4/1971 | Hofstein | 178/7.1 |
| 3,617,753 | 1/1970 | Kato et al. | 250/211 J |
| 3,636,358 | 1/1972 | Groschwitz | 250/211 J |
| 3,717,724 | 2/1973 | Montgomery | 178/5.4 R |
| 3,739,240 | 6/1973 | Krambeck | 317/235 R |
| 3,792,322 | 2/1974 | Boyle et al. | 317/235 R |
| 3,796,927 | 3/1974 | Boyle et al. | 317/235 R |
| 3,860,956 | 1/1975 | Kubo et al. | 358/48 |
| 3,869,572 | 3/1975 | Carter | 178/7.1 |
| 3,898,685 | 8/1975 | Engeler et al. | 357/24 |
| 3,971,065 | 7/1976 | Bayer | 358/41 |
| 3,985,449 | 10/1976 | Patrin | 356/173 |
| 4,044,372 | 8/1977 | Weinstein et al. | 357/63 X |
| 4,233,329 | 9/1980 | Jamlistkar | 357/24 |

FOREIGN PATENT DOCUMENTS 1442464 7/1976 United Kingdom .

OTHER PUBLICATIONS

Dillon et al., "Integral Color Filters for Solid State Imagers"-Eastman Kodak-no date.
Barsan-"Overlaid Charge-Coupled Device", Electronics Letters 3-16-78 vol. 14, #6.

Primary Examiner—Robert L. Richardson
Attorney, Agent, or Firm—Thomas H. Close

[57] ABSTRACT

An image sensing element in a solid state imaging device is provided with a plurality of superposed channels disposed at respective distances from a light receiving surface of the device, each of such channels having a different characteristic spectral response due to the differential absorption of light by a semiconductor. By so disposing the channels, the device becomes a color imaging sensor having optimized resolution. The top channel, i.e. the channel nearest the surface of the device, may be either a "surface" channel or a "buried" channel, the lower channel(s) being buried channels. Depending upon the design of the element, either electrons or holes may be accumulated as photocharges in respective superposed channels. The color photocharges generated in respective channels of such an image sensing element are simultaneously moved in a plurality of superposed channels by a multiple superposed channel signal handling device such as a multiple channel charge coupled device (CCD), thus the solid state imaging device does not require special timing networks to correct for phase differences between color signals which result from a common point within an image.

27 Claims, 14 Drawing Figures

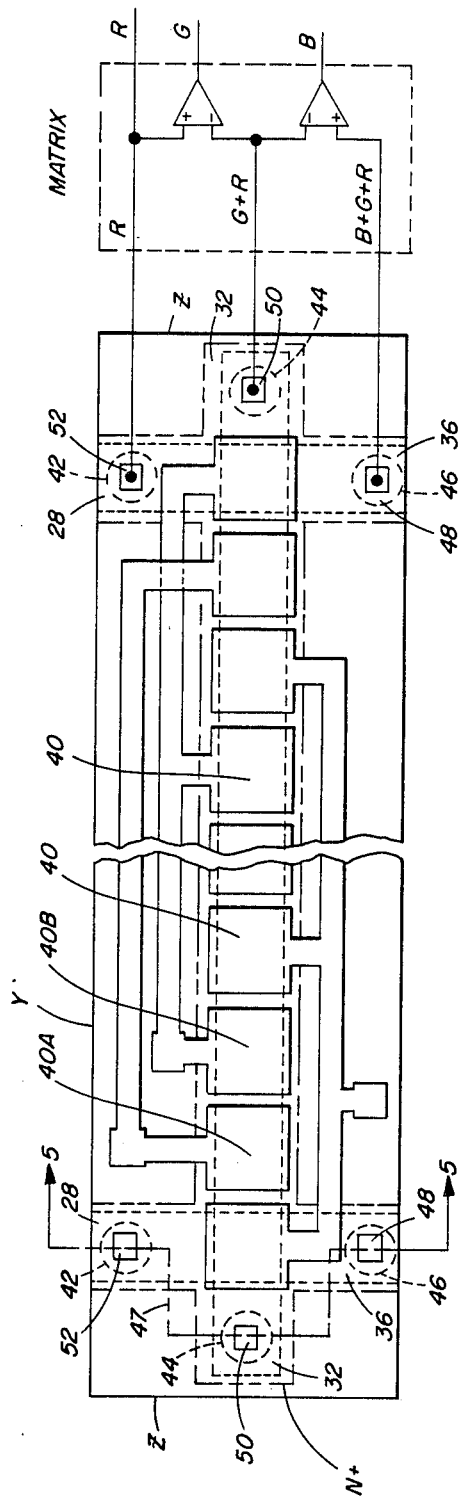
FIG. 3
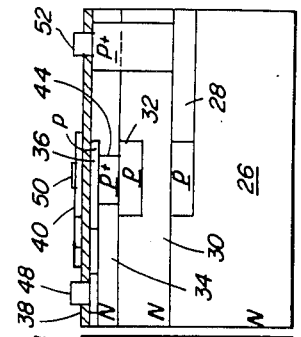
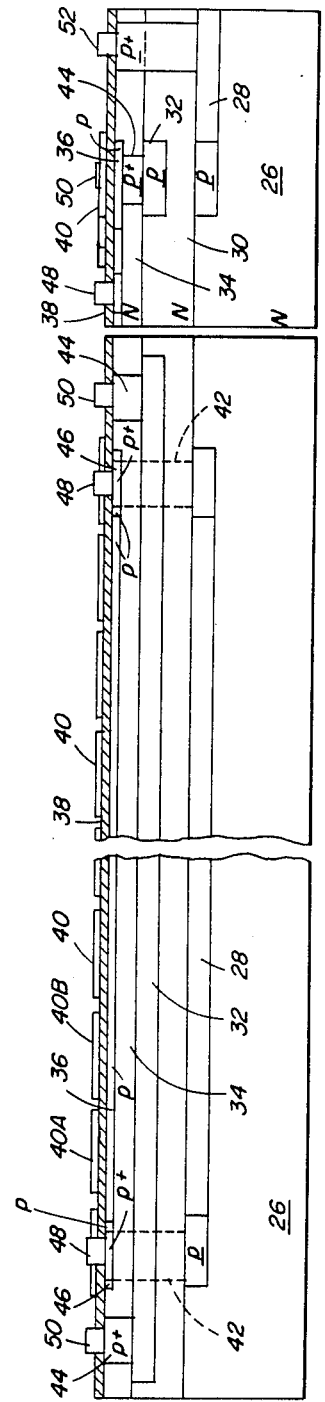
FIG. 4
FIG. 5

FIG. 9
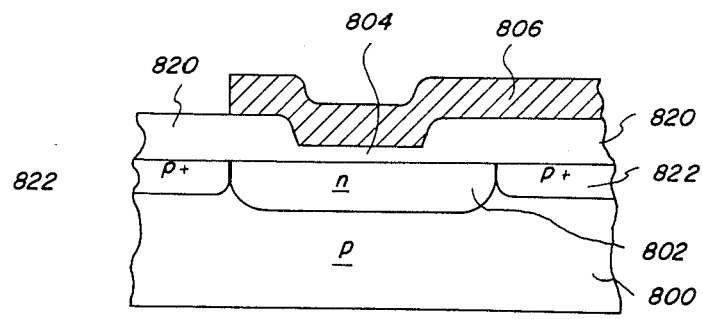
FIG. 10
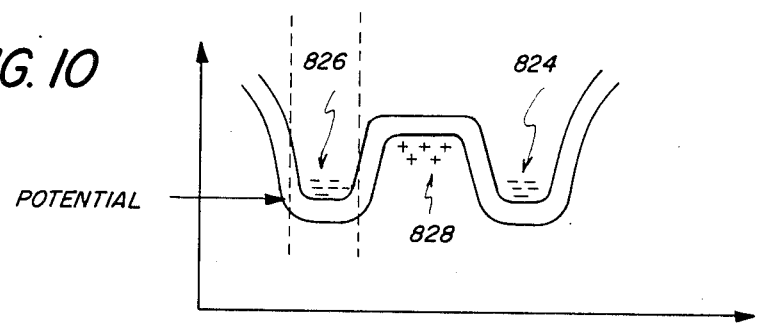
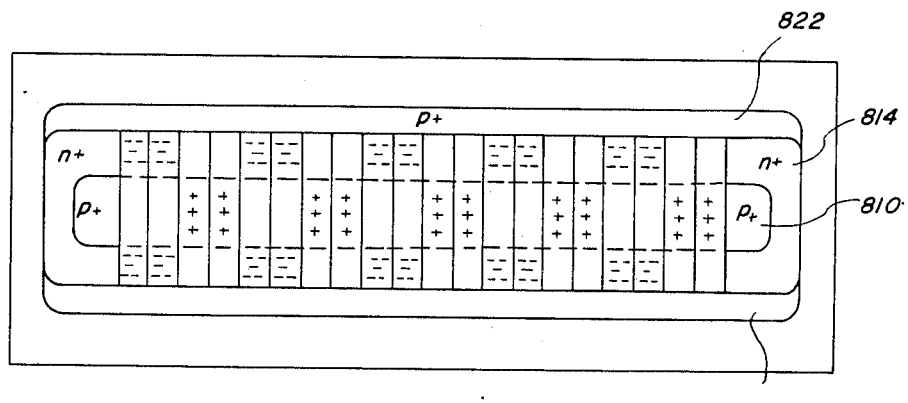
FIG. 11

COLOR RESPONSIVE IMAGING DEVICE EMPLOYING WAVELENGTH DEPENDENT SEMICONDUCTOR OPTICAL ABSORPTION

CROSS-REFERENCE TO RELATED APPLICATIONS

This is a continuation-in-part of U.S. Ser. No. 885,920 filed Mar. 13, 1978 which was a continuation of U.S. Ser. No. 780,944 filed Mar. 24, 1977 both applications now abandoned.

BACKGROUND OF THE INVENTION

1. Field of the Invention

This invention relates in general to imaging devices, and in particular to solid state color imaging devices.

2. Background Relative to the Prior Art

The prior art, say, for color cameras, involves electron beam scanned tubes: A three color signal is derived by either utilizing three tubes with a beam splitter and optical filters or one tube with a color stripe filter affixed to the image receiving surface of the target. The former method requires the maintenance of registration of the image on the three separate tubes and the latter method suffers from loss of resolution, at least in part, because the stripe filter must be separated from the target by approximately 100 microns.

Recent U.S. patents, namely, U.S. Pat. Nos. 3,860,956 and 3,576,392, describe single beam scanned color image tubes which do not utilize color filters. The target of each tube is comprised of a plurality of photodiodes. The color imaging capability arises from the intrinsic wavelength dependent optical absorption of the target material, which in both cases is silicon. Blue light is more strongly absorbed than green light which is, in turn, more strongly absorbed than red light. This is termed differential optical absorption. The imagers described in '956 and '392 have their photodiodes grouped into pixel triads and are so constructed that each member of a triad has a different spectral sensitivity. For '956, the pixels are sensitive to blue (B), blue plus green (B+G), and blue plus green plus red (B+G+R). For '392, the pixels are sensitive to (R), (R+G) and (R+G+B).

Various techniques for providing a solid state color imaging device have started to appear in the literature. These solid state devices are based upon arrays such as charge coupled devices (CCD's), charge injection devices (CID's), photodiodes, and phototransistors, which are self-scanned as opposed to beam-scanned image tubes.

U.S. Pat. No. 3,971,065 to Bayer discloses one approach to implementation of such solid state arrays. The general approach of Bayer is by the use of special arrangement to triads of color filters overlaying the imaging sites. The color filter mosaic optimizes the resolution for a fixed number of image sites. A CCD imager incorporating this concept was reported by Dillon et al, International Electron Devices Meeting, Washington, D.C., December 1976.

Published Patent Application B-502,289 describes another solid state imager, such imager employing a color coding filter affixed to a solid state, self-scanned array.

A third approach to solid state color imaging, which approach utilizes the differential optical absorption of the silicon substrate to provide the three color signal, is described in U.S. Pat. No. 3,985,449. This approach employs adjacent pixel triads. As a result of different voltage biasing conditions the three pixels of a triad are sensitive to (B), (B+G) and (B+G+R), respectively.

Yet another approach to solid state color imaging is shown in U.S. Pat. No. 3,717,724. According to this approach, a sandwich comprised of a plurality of image sensing arrays is employed to generate a plurality of color signals. Each image sensing array in the sandwich is comprised of a semiconductor material adapted to selectively absorb a certain portion of the electromagnetic spectrum. Associated with each image sensing array is a plurality of contact elements arranged for retrieving the photosignals generated by the array.

SUMMARY OF THE INVENTION

According to the present invention, a solid state color imaging device utilizing differential optical absorption includes an image sensing element capable of providing, simultaneously, a plurality of color photosignals from a single image sensing site. Furthermore, the photosignals are processed simultaneously in the device thereby maintaining proper phase relation between respective signals. The image sensing element comprises a semiconductor substrate having a light receiving surface and a plurality of superposed light responsive signal generating regions for generating a corresponding plurality of photosignals. The signal generating regions are disposed at different distances from the light receiving surface so that respective regions have different spectral responses due to the differential absorption of the light by the semiconductor material. The photosignals generated by the signal generating regions are stored in a plurality of superposed channels which may be associated with a multiple superposed channel charge coupled device for moving the signals simultaneously within the device.

As may be known, multiple superposed channels may be created in a metal-insulator-semiconductor (MIS) device by providing a plurality of regions of alternating dopant type within the semiconductor material (see U.S. Pat. Nos. 3,739,240 and 3,792,322). FIG. 1a shows an unbiased energy band diagram for a generalized alternating layer MIS device.

When the structure is suitably biased by depleting the excess mobil charge carriers from each layer, a plurality of channels are formed which may be used to store and transport signal charge. FIG. 1b is an energy band diagram showing the generalized alternating dopant type MIS device of FIG. 1a in a biased condition.

As shown in FIG. 1b, immediately adjacent the insulating layer 10, there is an electron surface channel 11. In the first p-layer, there is a buried hole channel 16, and continuing deeper into the device, there are alternating electron and hole channels 17, 20 and 21, respectively. At the bottom of the device is another surface channel 23 capable of storing holes.

If a surface of the device is provided with a substantially transparent electrode, say electrode 12 in FIG. 1b, light falling on the surface of the device will penetrate the device to a wavelength dependent depth. When the energy of a photon is absorbed by the device, an electron-hole pair is created, either the electron or the hole or both may be employed as a photosignal. The electron will migrate to the nearest electron channel, and the hole to the nearest hole channel where they may be accummulated and employed as photosignals.

According to the present invention, any combination of a plurality of such channels may be employed in an image sensing element in a solid state color imaging device. The number, type (i.e. surface or buried; electron or hole), and distance of such channels from the light receiving surface of the image sensing element may be chosen to provide a desired spectral response for each channel.

In a presently preferred embodiment of the invention, a three color imaging device employing three buried hole channels is comprised of six layers of alternately different dopant types within the semiconductor material. By so setting the thicknesses of the first and second layers that a first color, because of differential absorption, is prevented from appreciably entering the third and subsequent layers—and by so setting the thickness of the first through fourth layers that a second color, because of differential absorption, is prevented from appreciably entering the fifth and sixth layers—a three channel color imaging device is provided: assuming the first, third and fifth layers are p-doped (acceptor doped), and the second, fourth and sixth layers (the sixth layer may comprise the original semiconductor wafer upon which the device is constructed) are n-doped (donor doped), a first signal generating region extends from the surface of the charge coupled device to somewhere within the n-doped second layer, although the first signal storage channel resides in the p-doped first layer; similarly, a second signal generating region extends from somewhere within the n-doped second layer to somewhere within the n-doped fourth layer, the second signal storage channel resides in the p-doped third layer; and, finally, a third signal generating region extends from somewhere within the n-doped fourth layer to the n-doped sixth layer, the third signal storage channel resides in the p-doped fifth layer. Although each of the three signal generating regions has a width that includes adjacent non-signal-carrying layers, photon-generated signal carriers (i.e. holes) which occur within the non-signal-carrying layers selectively drift to, and are processed by, respective signal storage channels.

Assuming, for example, the first, second, and third colors are respectively blue, green and red, all photon-generated carriers produced within the first signal generating region by blue, green and red radiation drift to the first signal storage channel in the first layer for processing by gate electrodes on the surface of the device. Similarly, all photon-generated carriers produced within the second signal storage region by green and red radiation drift to the second signal storage channel in the third layer for processing by the gate electrodes. And all photon-generated carriers produced within the third signal generation region by red radiation drift to the third signal storage channel in the fifth layer for processing by the gate electrodes. Thus, the gate electrodes of the device are common to all three channels (i.e. triads comprise superpositioned—as opposed to side-by-side—regions of the device) and simultaneously process all three color signals in proper phase with each other.

By means of the teaching of the invention, side-by-side "color triads" are obviated, and the use of thin layers of different kinds of semiconductor materials sandwiched with pluralities of contact elements is avoided. As a consequence, an imaging array according to the invention possesses high spatial resolution since only one pixel (or image site) provides all color information; this is to be contrasted with solid state array schemes utilizing color filter overlays which require three pixels for the same color information. Furthermore, the incident radiation is, by means of the invention, more efficiently utilized since all "visible spectrum" photons which are incident upon a pixel will generate a signal charge in one of the three channels. This is to be compared with those color filter overlay schemes wherein two-thirds of the incident photons are wasted since, for example, green and blue photons incident upon a red sensitive pixel or image site will not contribute to the output signal.

In addition to the advantages noted above, since all the color signal information from a given pixel arrives simultaneously at the output of the array, decoding and delay circuitry is unnecessary. Thus, discrete color signals may be processed directly, for example, by well known linear matrix methods to achieve proper color balance for a particular display mode, such as television.

An alternative embodiment of the invention, a two color, superposed channel, image sensor, is disclosed to illustrate the use of the combination of surface and buried, electron and hole channels in a multiple superposed channel device. In the alternative embodiment, the first (or top) channel is a surface-hole channel and the second channel is a buried-electron channel.

The use of opposite polarity carriers in one device poses a special problem of lateral confinement of both carrier types in the channels of the device. For example, a potential well capable of confining carriers of one polarity (say electrons) appears as a potential hill to carriers of opposite polarity (holes) and is therefore incapable of confining such carriers. The conventional channel stopping techniques employed for lateral confinement of charge carriers in a CCD are effective to confine carriers of one polarity or the other, but not both. A further aspect of the present invention is a means for confining carriers of both polarities in a multiple superposed channel device by providing a dual-action potential profile having potential wells for either polarity of carrier.

BRIEF DESCRIPTION OF THE DRAWINGS

The invention will be described in detail with reference to the drawings, wherein:

FIG. 3 is a plan view of an imaging array incorporating the presently preferred embodiment of the invention;

FIG. 4 is a generally schematic elevational view of the imaging array shown in FIG. 4;

FIG. 5 is a sectional view of the array of FIG. 3 taken generally along lines 5—5 thereof;

FIG. 9 is a cross-sectional view of the array of FIG. 9 showing the dual-action lateral channel confinement structure according to the invention;

FIG. 10 is an energy band diagram showing the channel potential created by the dual-action channel confinement configuration of FIG. 9; and FIG. 11 is a plan view of the linear imaging array of FIG. 8, showing opposite polarity carrier accumulation beneath alternate transfer electrodes.

Figure 2A:
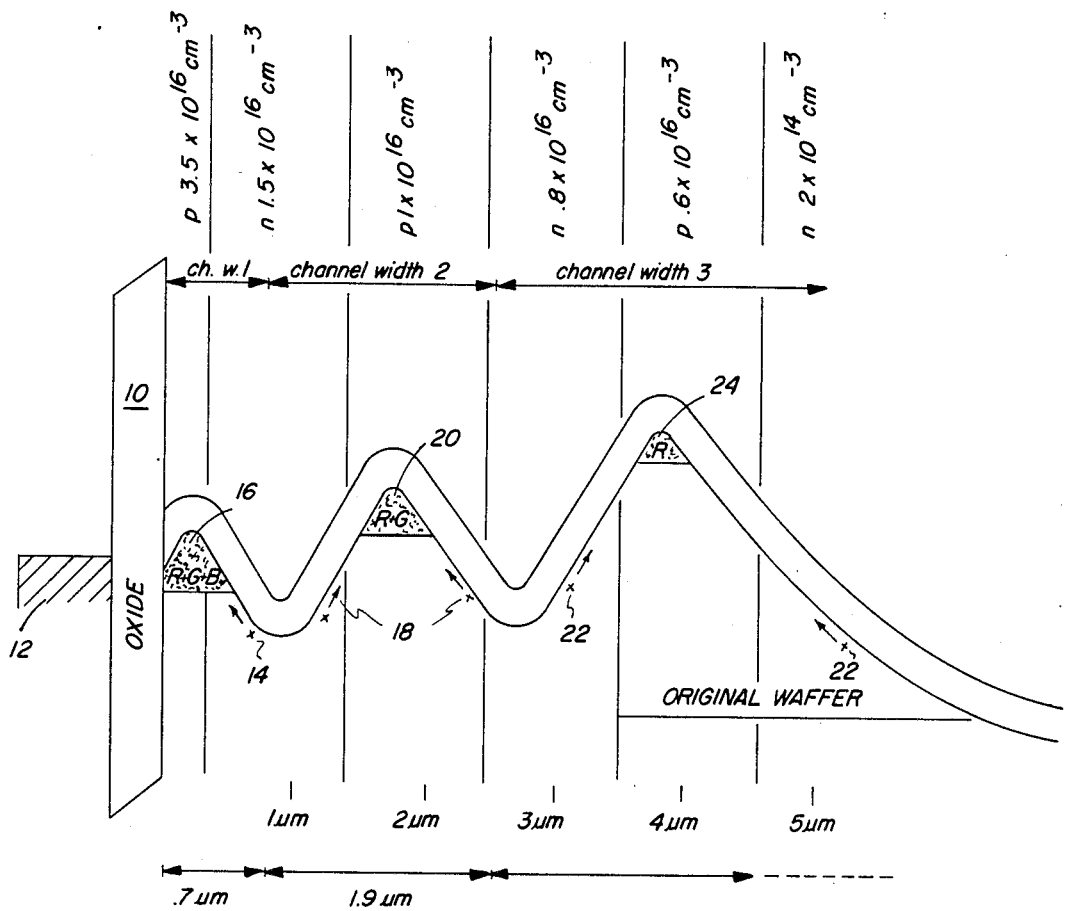
FIGS. 2a and 2b are energy band diagrams useful in describing the presently preferred embodiment of the invention.

Construction of a multiple superposed channel imaging device according to the presently preferred embodiment of the invention will be described with reference to the energy band diagram of FIG. 2a: Starting with an original wafer (6th layer) that contains $2 \times 10^{14}$ donor impurities per $cm^3$, a 1 $\mu$m thick p-doped (boron) region (5th layer) is ion-implanted into the wafer, the dopant level of the p-region being $0.6 \times 10^{16}$ impurities per $cm^3$. A 2 $\mu$m thick n-doped epitaxial layer is then grown atop the p-doped (5th) layer by heating the wafer in an atmosphere of arsenic-doped silane. The dopant level of the epigrown layer is $0.8 \times 10^{16}$ impurities per $cm^3$. Then, a 1 $\mu$m thick p-doped (boron) region ($1 \times 10^{16}$ impurities per $cm^3$) is ion-implanted into the epigrown n-doped layer to form two 1 $\mu$m thick layers, i.e. the third and fourth layers. Again, an epitaxially grown n-doped layer is formed atop the p-doped third layer by heating the wafer in an atmosphere of arsenic-doped silane, this epigrown layer being 1.3 $\mu$m in thickness. By ion-implanting to a depth of 0.3 $\mu$m ($3.5 \times 10^{16}$ boron impurities per $cm^3$) into the 1.3 $\mu$m thick layer, such layer is converted into a pair of layers, one of 0.3 $\mu$m thickness and one of 1 $\mu$m thickness (i.e. the first and second layers of the device). A gate oxide 10 is then grown or deposited atop the device, after which a transparent gate electrode(s) 12 is applied over the oxide.

The fabrication of the gate oxide and transparent gate structure is determined by the type of signal handling structure employed to move the photocharges generated in the multiple superposed channels, for example, two phase, three phase, or four phase type CCD may be employed. This aspect of the structure is well known in the art. A three phase CCD will be shown and described, however, a two or four phase CCD device could similarly be constructed.

Figure 2B:
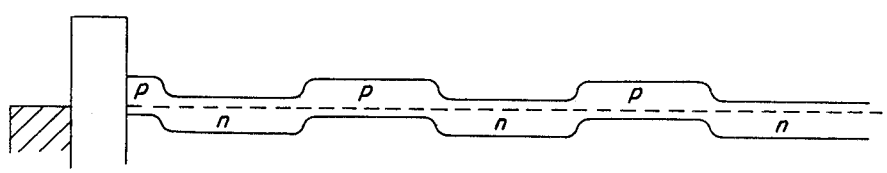

Suitable electrical contact must be established with the layers. This is accomplished away from the transfer gate area, namely, at the input or output end of a line of photoelements or transfer gates. With electrical contact so made, the p-doped first, third and fifth layers are reverse-biased with respect to the second and fourth layers and substrate. [The substrate, second and fourth layers are held at ground potential and the first, third and fifth layers are held at negative voltage.] The unbiased energy band diagram is shown in FIG. 2b. Application of such reverse bias causes all mobile charges to be drained from the layers, resulting in the energy band profile shown in FIG. 2b. The exact shape of the energy band diagram depends primarily upon the doping levels of the various layers, the substrate doping, the gate oxide thickness and the voltage applied to the charge draining electrode. Once these parameters are known, the energy band diagram is obtained by solution of the Poisson equation.

The layer thicknesses and doping levels of FIG. 2a, with an oxide thickness of 0.2 $\mu$m, and with small negative "biasing" voltage, produce relative minima in the band diagram at approximately 0.7 $\mu$m and 2.6 $\mu$m below the oxide. The first photosignal generating region is approximately 0.7 $\mu$m wide being bounded by the oxide layer 10 interface and the first energy band minimum, i.e. the minimum nearest the oxide. The second photosignal generating region is approximately 1.9 $\mu$m wide being bounded by the two potential minima. The third photosignal generating region is more than 10 $\mu$m wide being bounded, in FIG. 2a, on the left by the second energy band minimum and on the right, several microns into the substrate, depending mostly on the minority carrier diffusion length.

The imager is irradiated from the gate side. Both the gate insulator and gate electrode are virtually transparent to visible light. Photons in the visible spectrum will be essentially completely absorbed in the layered structure since the penetration depth lies between 0.2 $\mu$m and 5 $\mu$m for the wavelength range 0.4 $\mu$m to 0.7 $\mu$m. Blue radiation is substantially absorbed within the 0.7 $\mu$m wide region nearest the oxide. Green radiation is substantially absorbed within the two regions closest to the oxide. Only red radiation penetrates deeper than the boundary between the second and third regions at 2.6 $\mu$m, and is therefore absorbed within the third region.

For the p-channel device just described, an absorption event generates a hole-electron pair, but only the hole is used as the signal charge. The hole is produced at the depth or location in the semiconductor at which the absorption event occurs. If a signal hole 14 is created in the first region (by a red, green or blue photon), it drifts to the potential well (for holes) 16 of the first signal storage channel; similarly, a signal hole 18 created in the second region, by a green or red photon, drifts to the potential well 20 of the second signal storage channel; and a signal hole 22 created in the third region (by a red photon) drifts to the potential well 24 of the third signal storage channel. The signal charge accumulates in the channels according to the radiation exposure incident upon the gate.

The electrostatic potential of the three potential wells in which the signal charge accumulates may be manipulated by the gate voltage. It should be appreciated that the potential wells associated with all three color channels are controlled by a single gate voltage, and therefore the signal holes may be manipulated simultaneously, for example, transferred from the region beneath one gate to the region beneath an adjacent gate, just as for a conventional single channel CCD as is well known in the art.

Referring now to FIGS. 3-5, a three channel, three phase, linear CCD comprises the imaging device according to the invention and includes an n-doped silicon wafer (chip) 26 into which a p-doped layer 28 is ion-implanted. An epigrown n-doped layer 30, formed over the layer 28, has a p-doped layer 32 ion-implanted into it; and an epigrown n-doped layer 34 has a p-doped layer 26 ion-implanted into it. As taught in connection with FIG. 3a, the ion-implanted layers 28, 32 and 36 are 1 $\mu$m, 1 $\mu$m and 0.3 $\mu$m thick, respectively; and the epigrown layers 30 and 34 are 2 $\mu$m thick.

Transparent $SiO_2$ 38 covers the face of the device, and overlaying the oxide covering is a linear array of transparent gate electrode(s) 40 appropriately interconnected for purposes of charge transfer.

The ion-implanted layer 36 fans out, at either end of, and to the side X of the device. Similarly, the ion-implanted layer 28 fans out, at either end of, and to the side Y of the device. And the ion-implanted layer 32 extends, at either end of the device, toward the extremities Z—Z.

Heavily p-doped diffusions 42, 44 and 46 extend from windows in the nonconductive oxide layer 38 to, respectively, the signal-processing p-channels 28, 32 and 36, ohmic metal contacts 48, 50 and 52 being made, respectively, to the diffusions 42, 44 and 46. A channel stop diffusion 47, shown only in FIG. 2, confines photon-generated charges to processing by the gate electrode(s) 40.

A typical environment in which the device of FIGS. 3-5 would find use would be in the line scanning of images . . . and typical operation of the device would have reverse-biasing negative voltages applied to the contacts (terminals) 48, 50 and 52. Such voltages would deplete mobile carriers from the signal handling channels 28, 32 and 36, and create the energy band profile of FIG. 2a. After a clocking period during which photon-produced holes have collected in the channels 28, 32 and 36, say under the gate electrode 40A (to which, nominally, a zero voltage is applied) a negative voltage would be applied to the electrode 40A, while the electrode 40B is caused to go to (or remain at) zero volts. This would cause the signal holes in each of the channels 28, 32 and 36 to shift simultaneously from under the gate 40A to under gate 40B. Further processing would be in accordance with techniques known to the art.

As noted heretofore, the present invention offers many improvements over previous solid state color imagers, namely, improved spatial resolution, higher effective quantum efficiency and the elimination of the need for signal decoding and delay circuits.

As the timed "superposed" color signals simultaneously exit the device they are applied to a matrixing circuit encompassing appropriate coefficients for the discrete colors as is known in the art. One such matrixing circuit, simply depicted, is indicated in connection with FIG. 3.

Figure 1A:
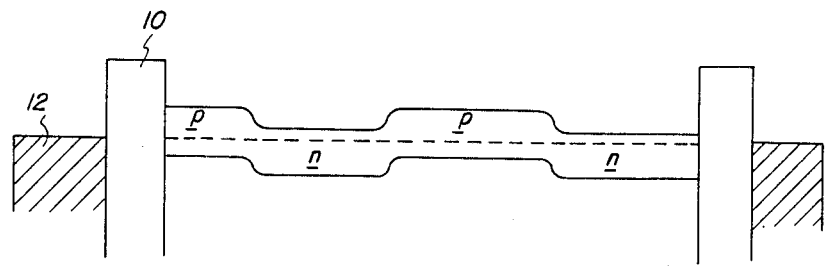
FIG. 1a is an energy band diagram showing a generalized metal-insulator-alternating dopant type semiconductor structure in an unbiased condition.
Figure 1B:
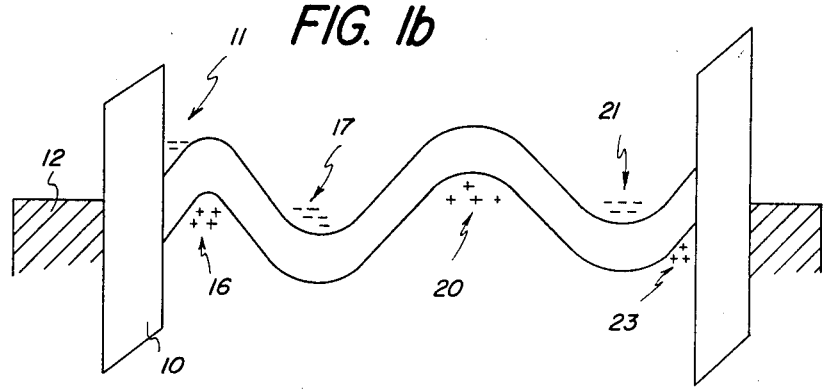
FIG. 1b is an energy band diagram showing the generalized metal-insulator-alternating dopant type semiconductor structure in a biased condition.
Figure 6:
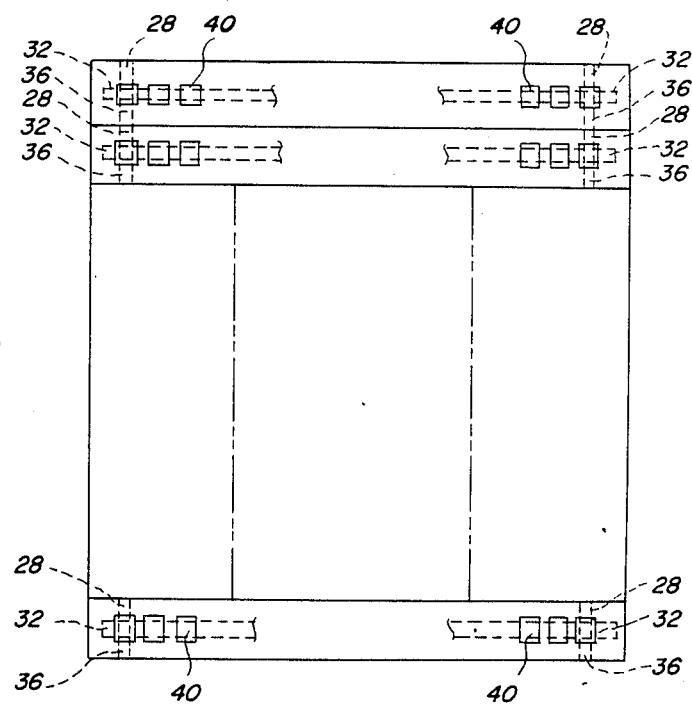
FIG. 6 is a schematic showing of an area array according to the invention.

While a linear imaging device is depicted in FIGS. 3-5, the concepts of the invention may be incorporated into an area imaging array, say in the manner depicted in FIGS. 6. And, while a p-channel device has been discussed in connection with FIGS. 3-5, an n-channel device would be the same as that shown in FIGS. 3-5, except that all impurity types noted in FIGS. 3-5 would be reversed, and gate and bias voltages would become positive.

An alternative embodiment of the present invention will now be described with reference to FIGS. 7-11 to illustrate the use of surface and buried channels and carriers of both types (i.e. holes and electrons) in one multiple superposed channel image sensing device. For purposes of example, a two channel device will be described.

Figure 7A:
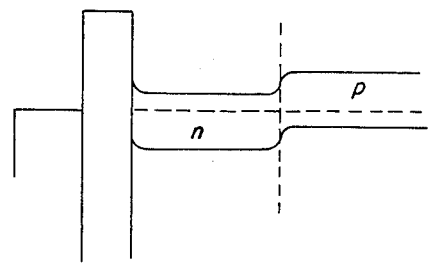
FIGS. 7a and 7b are energy band diagrams useful in describing the multiple superposed channel structure of an alternative embodiment of the invention, showing the channel structure in unbiased and biased states, respectively.
Figure 7B:
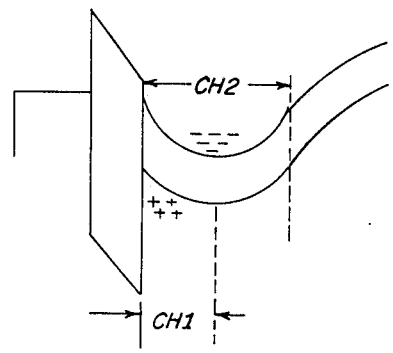

FIG. 7a shows an unbiased energy band diagram for an MIS device having a p-type substrate and an n-type layer disposed over the substrate. When the n-type layer is suitably biased, as shown in FIG. 7b, two channels are formed capable of accumulating and carrying photocharges. A surface hole channel, channel 1, extends from the surface of the device to somewhere near the middle of the n-type layer. A buried electron channel extends from the surface of the device to somewhere in the p-type substrate.

Figure 8:
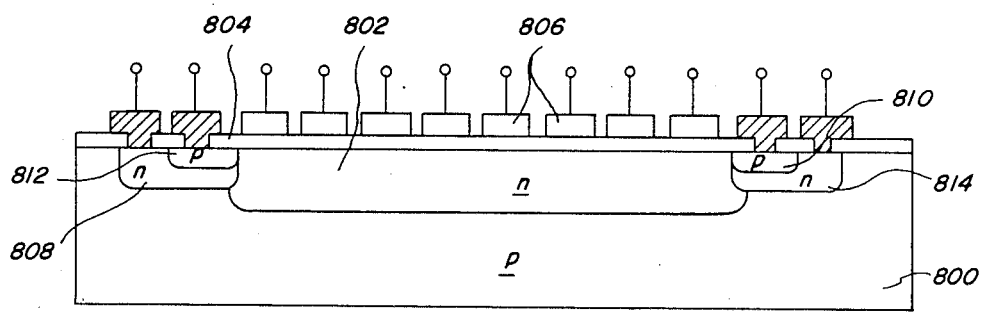
FIG. 8 is a generally schematic elevational view of a two color, linear imaging array according to the alternative embodiment of the invention.

A multiple superposed channel image sensor, configured as a linear CCD, and having the channel structure shown in FIGS. 7a-b is shown in FIG. 8.

The image sensor generally comprises a p-type silicon substrate 800, an n-type silicon layer 802, a silicon dioxide insulator layer 804, and a transfer gate structure 806. Input and output contacts are provided to the surface (hole) channel by highly doped (p+) areas 808 and 810, respectively. Input and output contacts are provided to the buried (hole) channel by highly doped (n+) areas 812 and 814, respectively. The intrinsic spectral responses of the two channels differ due to the differential absorption of light by the semiconductor material. An interesting problem arises in a device employing both types of carriers (holes and electrons) since a potential well for an electron appears as a potential hill for a hole and vice versa.

Normally in a buried electron channel device, the holes in the surface channel are not isolated from the substrate and would quickly flow in a direction transverse to the transfer direction in the CCD to the substrate, thereby loosing the signal generated in the surface channel. An important feature of the present invention is a means for confining carriers of opposite polarity types in a multiple superposed channel structure.

Two-carrier confinement can be effected, according to the invention, by providing a structure that generates a complex potential profile, transverse to the signal transfer direction, forming potential wells for both polarities of carrier. Such a structure is shown in FIG. 9, which depicts a cross section of a unit cell of the CCD device of FIG. 8. The complex potential is generated by a combination of two factors slightly displaced from one another and each tending to cause the energy bands to be displaced in opposite directions. A thick gate oxide 820 extends part way into the channel area on either side. The effect of the thick gate oxide is to cause the buried electron channel to be deeper. A channel stopping diffusion 822, slightly displaced from the thick gate oxide, has the effect of causing the buried electron channel to be less deep. The combination has the effect of producing a dual-action channel stop having the energy band profile shown in FIG. 10. As seen from FIG. 10, electrons in the buried channel will accumulate in the potential wells 824 and 826 formed at the sides of the channel, and holes formed in the surface channel will accumulate in the potential well 828 formed near the central portion of the channel. To provide nearly equal charge carrying capacity for both the electron and hole channels, the device may be designed to that the width of the hole channel is substantially equal to the sum of the widths of the electron channels. When the dual-action stop is employed in a CCD imaging device of the type shown in FIG. 8, the resulting charge configuration is shown in FIG. 11. As seen in FIG. 11, electrons and holes reside beneath different electrodes thereby displacing the signal packets both laterally and horizontally.

If two phase clocking is employed, the electron and hole charge packets may be transferred in opposite directions within the device, to be read out at opposite ends of the CCD structure. When three or four phase clocking is used, both electron and hole charge packets may be transferred in the same direction to an output contact structure at one end of the device.

An output contact structure for the device may be configured by diffusing or ion-implanting an n+ region 814, as shown in FIG. 11, making contact with the n-type layer 802 (shown in FIG. 8) across the end of the channel, and between the p+ channel stops 822. Contact to the surface hole channel is effected by ion-implanting a p+ island 810 within the n+ region 814 adjacent the thin oxide portion 804 of the channel. As shown in FIG. 8, the p+ island 810 does not extend completely through the n+ region 814 to avoid shorting the surface channel to the substrate.

The invention has been described in detail with particular reference to a preferred embodiment and an alternative embodiment thereof, but it will be understood that further variations and modifications can be effected within the spirit and scope of the invention. For example, while two and three channel devices have been described, similar such devices having any number of superposed channels greater than one would be within the scope of the invention, provided, of course, that the channels are selective of color due to differential absorption of light by the semiconductor. And, if desired, filters may be applied over the device to limit the response of the device, say, to the visible spectrum. Furthermore, although front illuminated devices employing transparent electrodes over the photosensing sites have been shown, backside illuminated devices according to the invention may also be constructed.

We claim:

1. In a solid state device of the type comprising a semiconductor material having a plurality of regions of alternating dopant types within the material, the device having a light receiving surface, a photosensitive element for simultaneously generating a plurality of photosignals, comprising:
   a. first channel means for collecting a first photosignal generated, in response to light falling on said light receiving surface, in a first region extending to a first depth, with respect to said surface, within said semiconductor material, said first channel means having a predetermined spectral response; and
   b. buried channel means, disposed beneath said first channel means, with respect to said surface, for collecting a second photosignal generated, in response to light falling on said surface, in a second region extending to a second depth greater than said first depth, said second channel means having a predetermined spectral response different from said spectral response of said first channel due to the differential absorption of light by the semiconductor material, said first and second photosignal generating regions being superposed within said element.

2. The invention claimed in claim 1 wherein said first channel means comprises a surface channel.

3. The invention claimed in claim 1 wherein said first and said second photosignals are comprised of carriers of opposite polarity types, and wherein said photosensitive element further comprises: dual-action channel defining means for confining both of said polarity type carriers in their respective channels.

4. The invention claimed in claim 3 wherein said dual-action channel defining means, comprises: a heavily doped channel stopping region disposed adjacent said channel means and a thick field oxide disposed over said channel stopping region and extending partially over said channel means, whereby, the channel potentials bend in one direction beneath said thick field oxide, and in the opposite direction beneath said channel stopping region, to thereby define potential wells for carriers of both polarity types.

5. A solid state color responsive imaging device, comprising:
   a. a semiconductor substrate having a light receiving surface;
   b. first photoresponsive means disposed at a first depth beneath said surface for generating a first photosignal in response to light of a first range of wavelengths impinging on said surfae; and
   c. second photoresponsive means disposed directly beneath said first means at a second depth beneath said surface for generating a second photosignal in response to light, in a range of wavelengths narrower than said first range due to the differential absorption by said semiconductor, impinging on said surface, thereby providing an imaging device having enhanced spatial resolution and high efficiency of utilization of incident light.

6. A solid state color responsive imaging device, comprising:
   a. a semiconductor substrate having a light receiving surface;
   b. first photoresponsive means disposed at a first depth beneath said surface for generating a first photosignal in response to light of a first range of wavelengths impinging on said surface;
   c. second photoresponsive means disposed directly beneath said first means at a second depth beneath said surface for generating a second photosignal in response to light, of a second range of wavelengths different from said first range, impinging on said surface, and
   d. charge coupled device means for moving said first and second photosignals simultaneously within said device at said respective depths, whereby phase differences between respective color signals arising from respective photoresponsive means beneath a common point on said surface of said device are obviated.

7. In a solid state color imaging array, an image element comprising
   a semiconductor substrate having a light receiving surface and a plurality of superposed light responsive channels for generating a corresponding plurality of photosignals, said channels being disposed at different distances from said light receiving surface such that respective channels receive different wavelengths of light due to the differential absorption of light by the semiconductor material, whereby a plurality of color signals are generated by one image element when exposed to a plurality of wavelengths of light, thereby enhancing the spatial resolution of the imaging array and affording efficient utilization of the light energy incident on the image element.

8. A solid state color imaging device comprising:
   a. a semiconductor substrate having a light receiving surface and a plurality of superposed light-responsive channels for generating a corresponding plurality of photosignals, said channels being disposed at different distances from said light receiving surface such that respective channels receive different wavelengths of light due to the differential absorption of light by the semiconductor material, whereby a plurality of photosignals representing different colors are generated in said channels when said device is exposed to a plurality of wavelengths of light; and
   b. charge coupled device means for moving said plurality of color signals simultaneously within said imaging device, whereby phase differences between respective color signals arising from a common point within an image are obviated.

9. A solid state imaging device comprising:
   a. a chip of semiconductor material comprising at least six layers of alternately different dopant types;
   b. means for scavenging mobile majority charge carriers from said first, third and fifth layers to form respective buried charge transporting channels in those layers;
   c. nonconductive transparent means covering the surface of the said first layer; and
   d. transparent electrode means on said transparent nonconductive means.

10. The device of claim 9 wherein the thicknesses of said layers are such that, in response to incident white light falling on the electrode means on the device, substantially no blue light penetrates to said third layer and substantially no green light penetrates to said fifth layer.

11. The device of claim 9 wherein said chip is comprised of silicon, and said first layer is less than about 0.7 $\mu$m in thickness.

12. The device of claim 9 wherein said chip is comprised of silicon and the combined thickness of said first, second and third layers is less than about 2.6 $\mu$m, and the combined thickness of said first, second, third and fourth layers is greater than 2.6 $\mu$m.

13. The devide of claim 9 wherein said chip is comprised of silicon, said first layer is less than about 0.7 $\mu$m in thickness, and the combined thickness of the first, second and third layers is less than about 2.6 $\mu$m, and the combined thickness of said first, second, third and fourth layers is greater than 2.6 $\mu$m.

14. An image sensor device comprising:
   a. a wafer of silicon;
   b. a transparent oxide of silicon on said wafer;
   c. a plurality of rows of transparent electrode means on said oxide,
   said wafer having at least six contiguous layers, each being doped with impurity atoms, and each being doped with a type impurity different than any of its contiguous layers, said layers being disposed so that said oxide is contiguous with said first layer; and
   d. respective ohmic row contacts to the first, third and fifth layers for removing mobile majority carriers from those layers.

15. The image sensor device of claim 14 wherein the layers of the device are such that first, second and third colors are absorbed within the combination of said first and second layers, said second and third colors are absorbed within the combination of said second, third and fourth layers, and said third color is absorbed within the combination of said fourth, fifth and sixth layers.

16. The sensor device of claim 14 wherein the first layer is less than about 0.7 $\mu$m in thickness.

17. The device of claim 14 wherein the combined thickness of said first, second and third layers is less than about 2.6 $\mu$m, and the combined thickness of said first, second, third and fourth layers is greater than 2.6 $\mu$m.

18. The sensor of claim 14 wherein:
   a. the first layer is less than about 0.7 $\mu$m in thickness;
   b. the combined thickness of said first, second and third layers is less than about 2.6 $\mu$m; and
   c. the combined thickness of said first, second, third and fourth layers is greater than 2.6 $\mu$m.

19. In combination:
an imaging device comprising:
A.
   a. a chip of silicon having at least six layers, each layer being doped with impurity atoms, and each being doped with an impurity type different than a layer contiguous therewith;
   b. a transparent oxide of silicon covering the first of said layers;
   c. transparent electrode means covering said oxide; the first layer being less than 0.7 $\mu$m in thickness, the combined thickness of said first, second and third layers being less than 2.6 $\mu$m, and the combined thickness of said first, second, third and fourth layers being greater than about 2.6 $\mu$m;
   d. first, second and third ohmic contacts respectively to said first, third and fifth layers; and
B.
   a. means coupled to said first and second ohmic contacts for algegraically combining signals appearing at those contacts; and
   b. means coupled to the said second and third ohmic contacts for algebraically combining signals appearing at those contacts.

20. A buried channel charge coupled imaging device comprising:
   a. first, second, third, fourth, fifth and sixth silicon layers which are respectively doped alternately with different type impurity atoms;
   b. a transparent nonconductive coating over the first of said layers;
   c. a row of transparent electrodes over said nonconductive coating;
   the first layer being less than about 0.7 $\mu$m in thickness; the combined thickness of said first, second and third layers being less than 2.6 $\mu$m; and the combined thickness of said first, second, third and fourth layers being greater than 2.6 $\mu$m; the first, third and fifth layers, respectively fanning out to either side of and beyond said row of electrodes, and
   d. ohmic contacts respectively to the fanned out portions of the first, third and fifth layers.

21. A multi-spectral charge coupled device for generating a plurality of signals representative of the spectral content of impinging photons comprising:
   a plurality of adjacent semiconductor layers arranged to generate a hole and an electron for each of said impinging photons;
   first and second collector means arranged to collect said generated holes or electrons and respectively generate first and second signals representative of said collected holes or electrons;
   said semiconductor layers having a predetermined optical absorption coefficient and said first and second collector means arranged such that said first and second signals are indicative of the spectral content of the impinging photons.

22. A multi-spectral charge coupled device as recited in claim 21, wherein
   said plurality of semiconductor layers comprise multiple buried layer including a plurality of layers for generating holes, and
   a plurality of layers for generating electrons interleaved with said plurality of layers for generating holes.

23. A multi-spectral charge coupled device for generating a plurality of signals representative of the spectral content of a stream of photons impinging on the surface of said device comprising:

a plurality of adjacent semiconductor layers arranged to generate a hole-electron pair for each photon of said photon stream, said hole-electron pair generated at a mean depth from the surface of said device which is a function of the wavelength of said respective photon;

first and second collector means arranged to collect said generated holes or electrons, said first and second collector means arranged at different depths from the surface of said device whereby the efficiency of collection of said holes or electrons are respectively different functions of the depth from the surface of said device at which said holes and electrons are generated; and output means, operatively connected to said first and second collector means for providing output signals representative of said collected holes or electrons whereby said signals are indicative of the spectral content of said impinging stream of photons.

24. A device in accordance with claims 21 and 23, wherein the ratio of the output signals from said first and second collector means are representative of the wavelength of said impinging photons.

25. A device in accordance with claim 24, wherein said device is arranged to contain a plurality of regions in a plane parallel to said surface of said device, and wherein the wavelength of said impinging photons is determined by the relationship between the output signals of adjacent regions.

26. A device in accordance with claims 21 or 23, wherein said device is arranged to contain a plurality of regions in a plane parallel to said surface of said device, and wherein the wavelength of said impinging photons is determined by the relationship between the output signals of adjacent regions.

27. In a multi-spectral charge coupled device for generating a plurality of signals representative of the spectral content of impinging photons and comprising a plurality of adjacent semiconductor layers arranged to generate hole-electron pairs for each photon of a photon stream impinging upon the surface of said device, the improvement comprising first and second collector means for collecting said holes or said electrons;

further comprising output means operatively connected to said first and second collector means for producing signals representative of said collected holes or electrons, whereby the ratio of said output signals representative of said collected holes or electrons is representative of the wavelength of said impinging photons.

* * * * *